(12) United States Patent
Rachmady et al.

(10) Patent No.: US 8,088,665 B2
(45) Date of Patent: Jan. 3, 2012

(54) METHOD OF FORMING SELF-ALIGNED LOW RESISTANCE CONTACT LAYER

(75) Inventors: Willy Rachmady, Beaverton, OR (US);
Jason W. Klaus, Portland, OR (US);
Ravi Pillarisetty, Portland, OR (US);
Niloy Mukherjee, Beaverton, OR (US);
Jack Kavalieros, Portland, OR (US);
Sean King, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 639 days.

(21) Appl. No.: 12/228,386

(22) Filed: Aug. 11, 2008

(65) Prior Publication Data
US 2010/0035399 A1    Feb. 11, 2010

(51) Int. Cl.
*H01L 21/336* (2006.01)
(52) U.S. Cl. ............ 438/299; 438/682; 257/E21.409
(58) Field of Classification Search ............ 438/299, 438/682
See application file for complete search history.

(56) References Cited

U.S. PATENT DOCUMENTS

| | | | |
|---|---|---|---|
| 5,880,505 A | 3/1999 | Fujii et al. | |
| 6,015,753 A | 1/2000 | Lin et al. | |
| 6,486,062 B1 | 11/2002 | Kluth et al. | |
| 6,534,390 B1 * | 3/2003 | Chong et al. | 438/592 |
| 6,730,588 B1 * | 5/2004 | Schinella | 438/592 |
| 7,323,411 B1 * | 1/2008 | Blosse | 438/674 |
| 7,410,913 B2 * | 8/2008 | Lee et al. | 438/778 |

* cited by examiner

*Primary Examiner* — Alexander Ghyka
(74) *Attorney, Agent, or Firm* — Winkle, PLLC

(57) ABSTRACT

Embodiments of the present invention describe a method of fabricating low resistance contact layers on a semiconductor device. The semiconductor device comprises a substrate having source and drain regions. The substrate is alternatingly exposed to a first precursor and a second precursor to selectively deposit an amorphous semiconductor layer onto each of the source and drain regions. A metal layer is then deposited over the amorphous semiconductor layer on each of the source and drain regions. An annealing process is then performed on the substrate to allow the metal layer to react with amorphous semiconductor layer to form a low resistance contact layer on each of the source and drain regions. The low resistance contact layer on each of the source and drain regions can be formed as either a silicide layer or germanide layer depending on the type of precursors used.

20 Claims, 6 Drawing Sheets

METHOD OF FORMING SELF-ALIGNED LOW RESISTANCE CONTACT LAYER

BACKGROUND OF THE INVENTION

1. Field of the Invention

The present invention relates to the field of semiconductor processing and more particularly to a method of forming self-aligned low resistance contact layers on a semiconductor device.

2. Discussion of Related Art

Low resistance contact layers, such as salicides, are commonly used to improve the performance of semiconductor devices, for example the transistor. Typically, the fabrication of salicides on a transistor involves the formation of self-aligned silicide layers on the source and drain regions. One of the advantages of using salicides is to improve the parasitic resistance in the source and drain diffusion regions that often results from the downscaling of source and drain dimensions.

FIGS. 1A-1D illustrate a conventional method of forming salicides on a typical transistor. Referring to FIG. 1A, the transistor comprises a substrate 100 having a gate dielectric layer 140 formed thereon. A poly-silicon gate 150 is formed on the gate dielectric layer 140. A cap layer 162 is formed on the top of the poly-silicon gate 150. Spacers 164, 166 are formed on the sidewalls of the poly-silicon gate 150. The substrate 100 comprises source and drain regions 110, 120 that are formed at opposite sides of the poly-silicon gate 150.

Next, an implant-based pre-amorphization step is performed on the substrate 100. The implant-based pre-amorphization step utilizes neutral species implants 200, such as germanium (Ge), to convert the monocrystalline source and drain regions 110, 120 into amorphous silicon regions 111, 121, as shown in FIG. 1B. Subsequently, in FIG. 1C, a metal layer 180 is blanket deposited on the substrate 100. Then, an annealing process is performed on the substrate 100, which causes the amorphous silicon regions 111, 121 to react with the portions of the metal layer 180 deposited thereon and form salicide regions 181, 182 in the substrate 100, as shown in FIG. 1D.

The method illustrated in FIGS. 1A-1D utilizes an implant-based pre-amorphization step to create amorphous silicon regions 111, 121 in the source, drain regions 110, 120. As a result, the thickness and profile of the salicide regions 181, 182 are dependent on the implant profile of the amorphous silicon regions 111, 121 formed during the implant-based pre-amorphization step. Thus, a non-uniform implant profile in the amorphous silicon regions 111, 121 can cause non-uniform formation of the salicide regions 181, 182 which affects the resistivity of the salicide regions 181, 182. Furthermore, possible recessing of the substrate 100 due to excessive consumption by the metal layer 180 causes high junction leakage. A two step annealing process can be used to rectify these problems but it increases the number of thermal cycle which causes dopant deactivation, dopant diffusion as well as junction leakage.

DETAILED DESCRIPTION OF THE PRESENT INVENTION

A method of forming self-aligned low resistance contact layers is described. In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a method of forming self-aligned low resistance contact layers on a semiconductor device. In an embodiment of the present invention, the semiconductor device comprises a substrate having a source region and a drain region. An amorphous semiconductor layer is then selectively deposited onto each of the source and drain regions by alternatingly exposing the substrate to a first precursor and a second precursor. In one embodiment, the substrate is alternately exposed to the first and second precursors by using a plasma enhanced chemical vapor deposition (PECVD) process at a constant low temperature of less than 400 degrees Celsius. Next, a metal layer is deposited on the amorphous semiconductor layer formed on each of the source and drain regions. Subsequently, an annealing process is performed on the substrate to allow the metal layer to react with the amorphous semiconductor layer formed on each of the source and drain regions to form a low resistance contact layer on each of the source and drain regions. In one embodiment, the low resistance contact layer formed on each of the source and drain regions is a silicide layer. In another embodiment, the low resistance contact layer is a germanide layer. By selectively depositing amorphous silicon layer onto each of the source and drain regions, the silicide layers can be formed with a uniform thickness and profile.

Figure 1A:
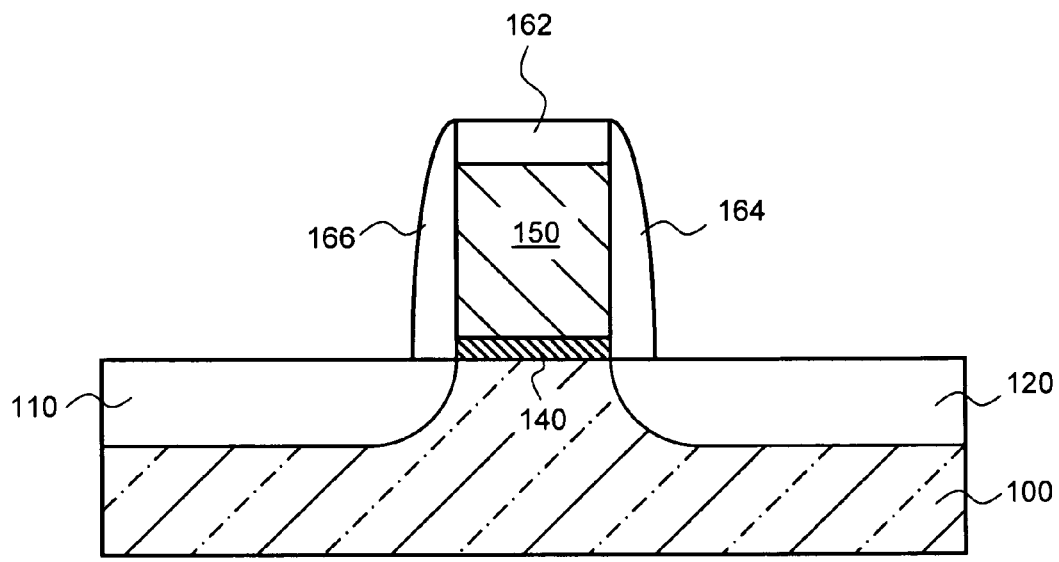
FIGS. 1A-1D are cross-sectional views that illustrate a conventional method of forming self-aligned silicides (salicides).
Figure 1B:
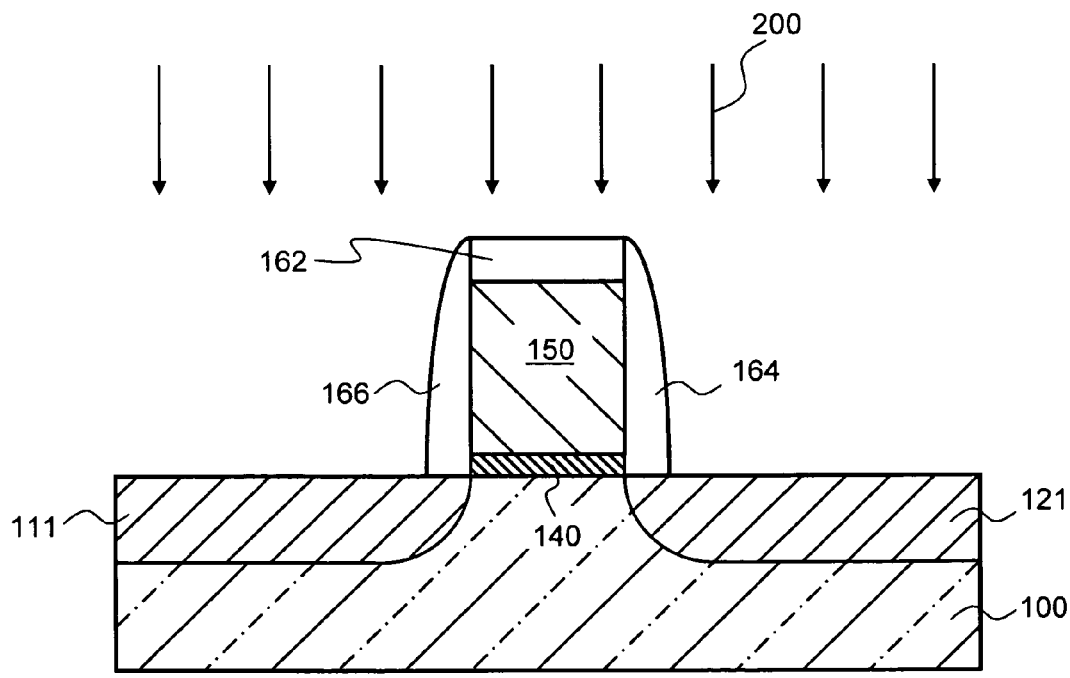
Figure 1C:
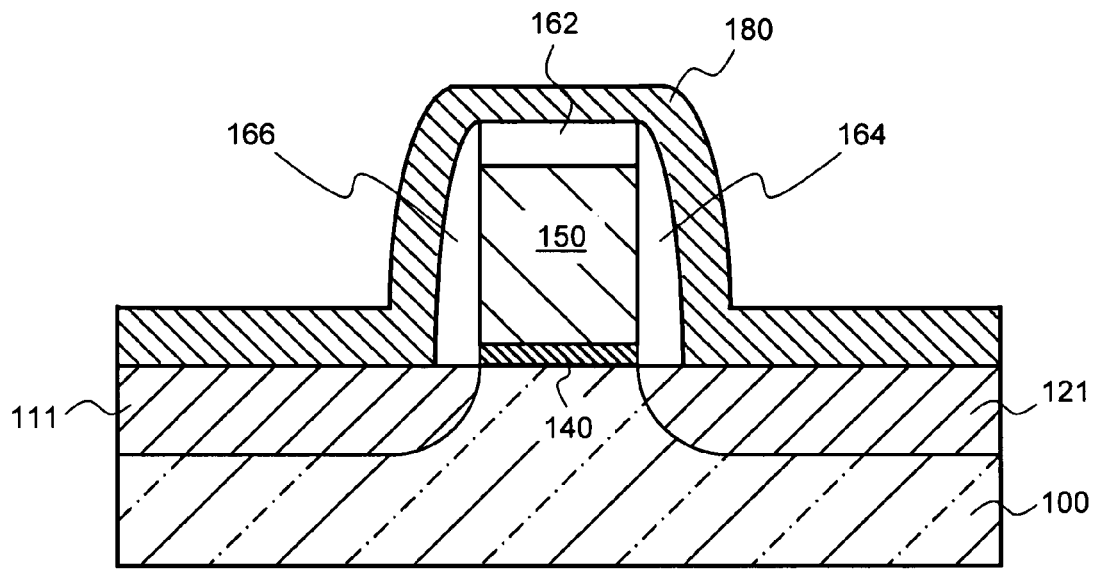
Figure 1D:
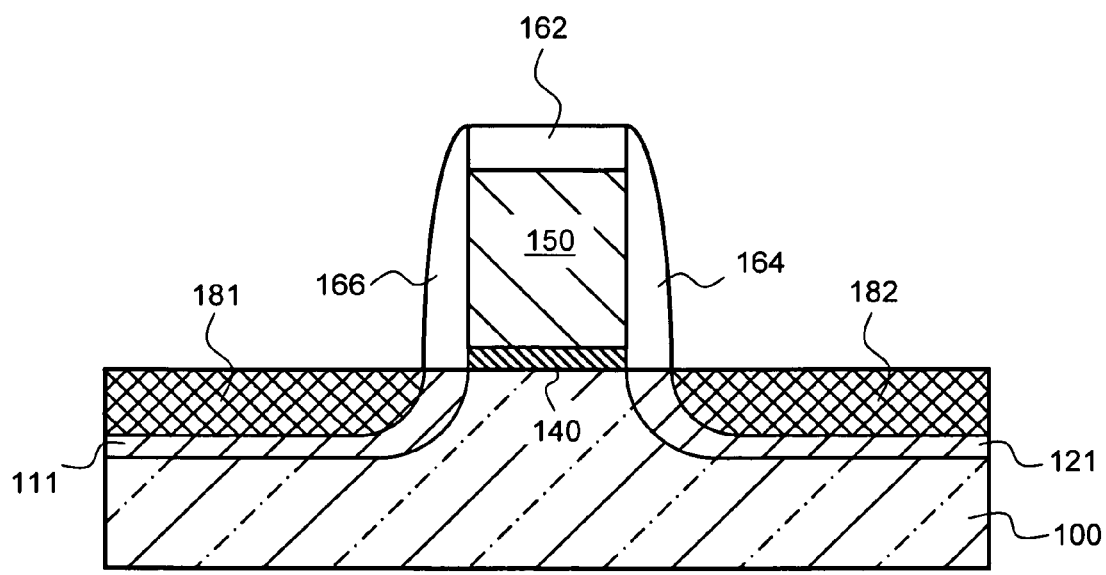
Figure 2A:
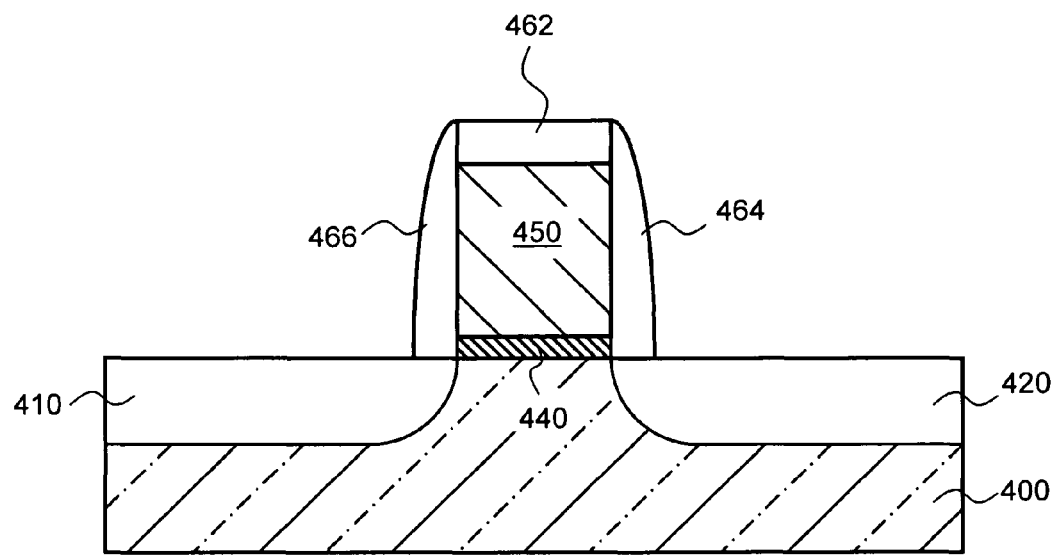
FIGS. 2A-2H are cross-sectional views that illustrate the method of forming a semiconductor device in accordance with one embodiment of the present invention.

A method of forming a semiconductor device with self-aligned low resistance contact layers in accordance with one embodiment of the present invention is illustrated in FIGS. 2A-2H. The fabrication of the semiconductor device begins by providing a substrate 400 as shown in FIG. 2A. In one embodiment of the present invention, the substrate 400 is made of monocrystalline silicon. In another embodiment, the substrate 400 is the silicon film of a silicon on insulator (SOI) substrate.

Substrate 400 comprises a gate dielectric 440 formed thereon. A gate electrode 450 is formed on the gate dielectric layer 440. In an embodiment of the present invention, the gate dielectric layer 440 is formed from any insulative material used for insulating the substrate 400 from the gate electrode 450. In one embodiment, the gate dielectric layer 440 is made of a material such as but not limited to silicon oxide (e.g., $SiO_2$). In another embodiment, the gate dielectric layer 440 is made of a high k dielectric material with a dielectric constant (k) substantially higher than the dielectric constant of silicon dioxide (i.e., k>3.9). For example, the high k dielectric material is a metal oxide dielectric, such as but not limited to tantalum oxide ($Ta_2O_5$), titanium oxide ($TiO_2$) and hafnium oxide ($HfO_2$). In another embodiment, the gate dielectric layer 440 is made of lead zirconate titanate (PZT) or barium strontium titanate (BST). The gate dielectric layer 440 is formed by any well know methods, such as but not limited to physical vapor deposition (PVD), chemical vapor deposition (CVD) or atomic layer deposition (ALD).

In an embodiment of the present invention, the gate electrode 450 is formed on the gate dielectric layer 440 as a sacrificial gate electrode that is subsequently replaced by an actual gate electrode in a replacement gate process. In one embodiment, the gate electrode 450 is made of a material, such as but not limited to polysilicon. A cap layer 462 is formed on top of the gate electrode 450. Cap layer 462 is made from a material that does not react with the precursors and metal layer during the subsequent processes that are described hereinafter. In one embodiment, cap layer 462 is made of a material such as but not limited to silicon nitride, silicon dioxide or silicon oxynitride. In an embodiment of the present invention, gate electrode 450 and cap layer 462 are deposited using PVD or CVD, and then patterned using well known photolithography and etching techniques.

Source region 410 and drain region 420 are formed in the substrate 400 on opposite sides of the gate electrode 450. In one embodiment, the semiconductor device can be formed as a PMOS or NMOS transistor. In the case of forming a PMOS transistor, the substrate 400 is doped to form source and drain regions 410, 420 with p-type conductivity. In the case of forming a NMOS transistor, the substrate 400 is doped to form source and drain regions 410, 420 with n-type conductivity. In an embodiment of the present invention, both the source and drain regions 410, 420 can be formed by ion-implantation process, wherein the gate electrode 450 acts as a mask to prevent the ion-implantation process from doping the channel region of the substrate 400. Channel region refers to the portion of the substrate located between the source and drain regions 410, 420 and beneath the gate electrode 450.

Spacers 464, 466 are formed along the entire sidewall width of the gate electrode 450. Spacers 464, 466 are made from a material that does not react with the precursors and metal layer during the subsequent processes that are described hereinafter. In one embodiment, the spacers 464, 466 are made of a material such as but not limited to a silicon nitride, silicon dioxide or silicon oxynitride. Spacers 464, 466 are formed using well known techniques of depositing a layer of spacer material over the entire substrate 400 and gate electrode 450, and then anisotropically etching the layer of spacer material to leave the spacers 464, 466 on the sidewalls of gate electrode 450.

Next, an amorphous semiconductor layer is selectively deposited on each of the source and drain regions 410, 420 and not deposited on the cap layer 462 and spacers 464, 466. In an embodiment of the present invention, the amorphous semiconductor layer is formed by alternatingly exposing the entire substrate 400 to a first precursor 800 and a second precursor 900. In one embodiment, the substrate 400 is alternatingly exposed to the first and second precursors 800, 900 in a plasma enhanced chemical vapor deposition (PECVD) process at a constant low temperature of less than 400 degrees Celsius and ideally less than 300 degrees Celsius. By using a constant low temperature, doping diffusion of the source and drain regions 410, 420 is minimized.

Figure 2B:
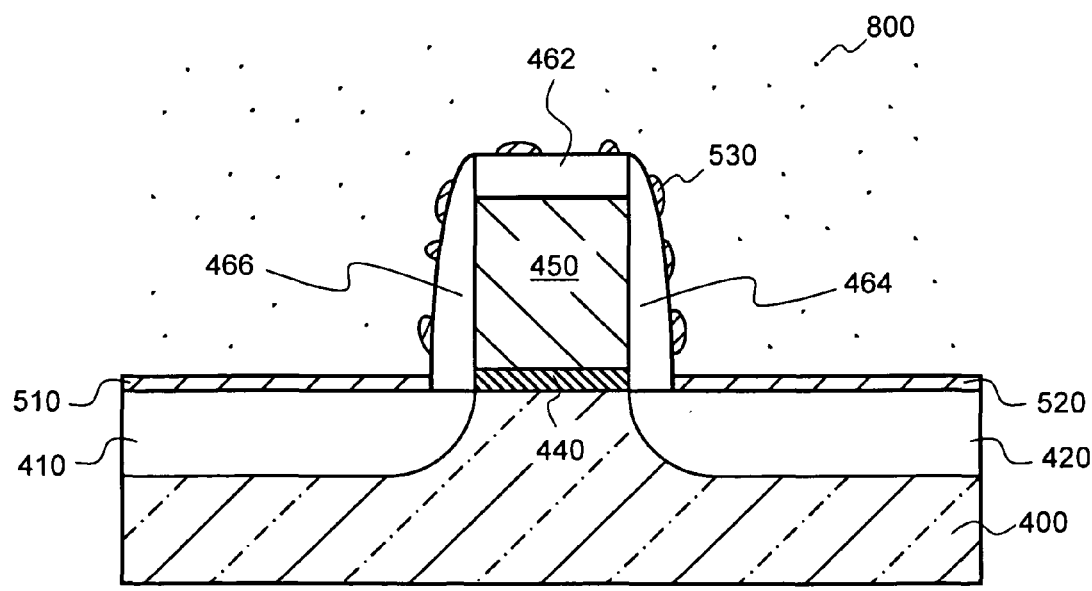

Beginning from FIG. 2B, the entire substrate 400 is exposed to the first precursor 800 that selectively deposits an amorphous semiconductor layer 510 on source region 410 and deposits an amorphous semiconductor layer 520 on drain region 420. Additionally, a plurality of amorphous semiconductor deposits 530 are formed on the cap layer 462 and spacers 464, 466. Due to the selective nature of the deposition, amorphous semiconductor layers 510, 520 are self-aligned to the source and drain regions 410, 420.

In an embodiment of the present invention, the first precursor 800 comprises a silicon-containing chemical compound, such as but not limited to silane ($SiH_4$) or disilane ($Si_2H_6$). In a specific embodiment, the substrate 400 is exposed to the first precursor 800, for example silane ($SiH_4$), at a temperature of 250-400 degrees Celsius, at a pressure of 1-10 torr, and for a time duration of 2 seconds. In this case, the amorphous semiconductor layers 510, 520 deposited on source and drain regions 410, 420 are amorphous silicon layers formed to a thickness of 50-200 Angstroms. In one embodiment, an inert gas such as but not limited to hydrogen ($H_2$) can be used in addition to silane ($SiH_4$) or disilane ($Si_2H_6$). For example, the first precursor 800 comprises a mixture of silane and hydrogen ($SiH_4+H_2$) or a mixture of disilane and hydrogen ($Si_2H_6+H_2$).

In another embodiment, the first precursor 800 comprises a germanium-containing chemical compound, such as but not limited to germane ($GeH_4$) and digermane ($Ge_2H_6$). In a specific embodiment, the substrate 400 is exposed to germane ($GeH_4$) at a temperature of 250-400 degrees Celsius, at a pressure of 1-10 torr, and for a time duration of 2 seconds. As a result, the amorphous semiconductor layers 510, 520 deposited on source and drain regions 410, 420 are amorphous germanium layers. In addition, an inert gas such as but not limited to hydrogen ($H_2$) can be used in addition to germane ($GeH_4$) and digermane ($Ge_2H_6$). For example, the first precursor 800 comprises a mixture of germane and hydrogen ($GeH_4+H_2$) or a mixture of digermane and hydrogen ($Ge_2H_6+H_2$).

Figure 2C:
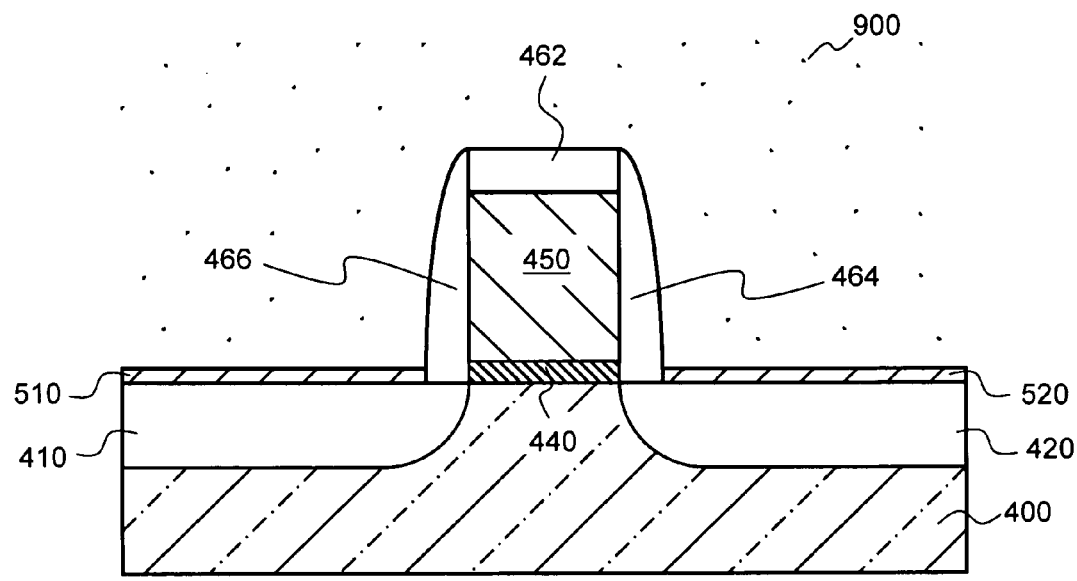

Next, in FIG. 2C, the entire substrate 400 is exposed to the second precursor 900 to remove the plurality of amorphous semiconductor deposits 530 on the cap layer 462 and spacers 464, 466. In one embodiment, the second precursor 900 is an etchant gas, such as but not limited to hydrogen ($H_2$) or helium (He).

In one embodiment, the first precursor 800 is removed from the substrate 400 before exposing the second precursor 900 to the substrate 400, so that only the second precursor 900 reacts with the plurality of amorphous semiconductor deposits 530. In the case where the first precursor 800 comprises silane ($SiH_4$) only, the flow of the first precursor 800 to the substrate 400 is stopped before allowing the second precursor 900, for example hydrogen ($H_2$), to flow to the substrate 400 in FIG. 2C. On the other hand, if the first precursor 800 comprises a mixture of silane and hydrogen ($SiH_4+H_2$), then the flow of silane ($SiH_4$) to the substrate 400 is stopped while the hydrogen (now acting as the second precursor 900) continues to flow to the substrate 400 in FIG. 2C. In a specific embodiment, the substrate 400 is exposed to the second precursor 900, for example hydrogen ($H_2$), at a temperature of 200-450 degrees Celsius, at a pressure of 1-10 torr, and for a time duration of 10-13 seconds.

The second precursor 900 is able to easily remove the plurality of amorphous semiconductor deposits 530 from the cap layer 462 and spacers 464, 466 due to the weak chemical bonding between the nuclei of each amorphous semiconductor deposit 530 and the cap layer 462 and spacers 464, 466. In particular, the second precursor 900 reacts with the plurality of amorphous semiconductor deposits 530 and converts the plurality of amorphous semiconductor deposits 530 into a gas phase, thus removing the plurality of amorphous semiconductor deposits 530 from cap layer 462 and spacers 464, 466.

On the other hand, the nuclei of amorphous semiconductor layers 510, 520 have a strong chemical bond with the source and drain regions 410, 420. Due to the strong chemical bonds, the second precursor 900 only removes a portion of the amorphous semiconductor layers 510, 520. The thickness of the amorphous semiconductor layers 510, 520 deposited during FIG. 2B and the duration of exposing the second precursor 900 to the substrate in FIG. 2C can be controlled so as to effectively remove the plurality of amorphous semiconductor deposits 530 and yet maintain sufficient thickness for the amorphous semiconductor layers 510, 520.

FIGS. 2B and 2C illustrate one cycle of selectively depositing amorphous semiconductor layers 510, 520 on the source and drain regions 410, 420. In one embodiment, the substrate 400 is exposed to the first precursor 800 for a duration of 2 seconds and then exposed to the second precursor 900 for a duration of 10-13 seconds in one cycle. The cycle is repeated using the same type of first and second precursors 800, 900 until a desired thickness of amorphous semiconductor layer is formed on each of the source and drain regions 410, 420.

Figure 2D:
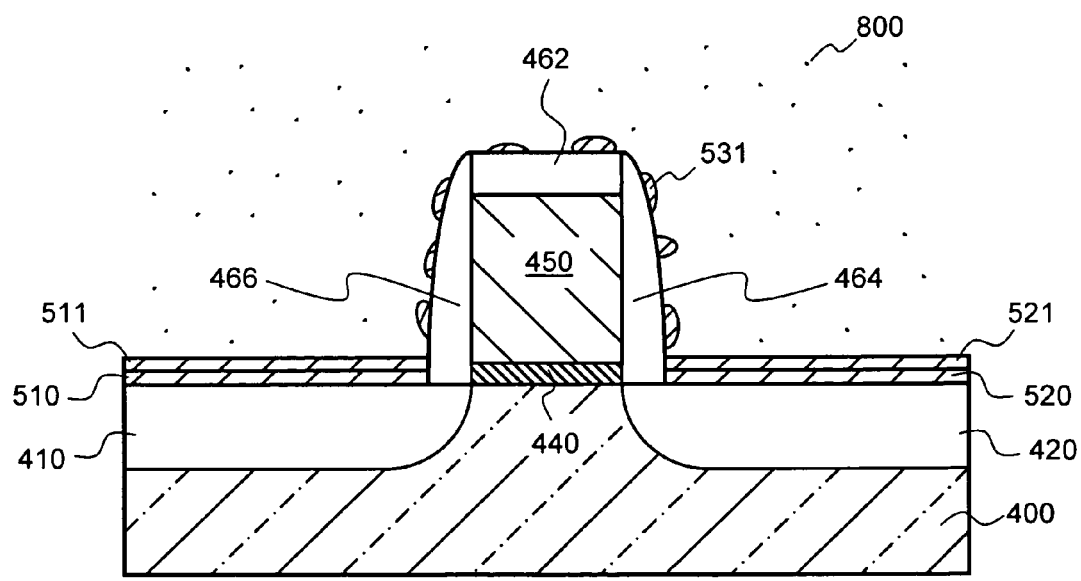
Figure 2E:
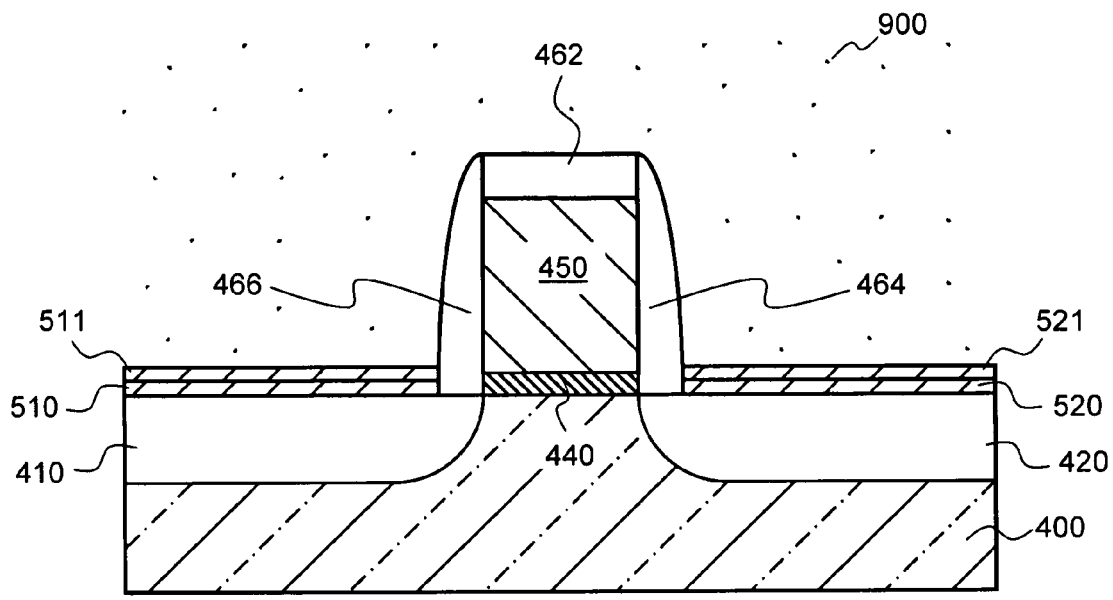

FIGS. 2D and 2E illustrate a subsequent cycle of selectively depositing the amorphous semiconductor layers using the same first and second precursors 800, 900. Continuing from FIG. 2C, the entire substrate 400 is again exposed to the first precursor 800 that deposits an amorphous semiconductor layer 511 onto the amorphous semiconductor layer 510 and also deposits an amorphous semiconductor layer 521 onto the amorphous semiconductor layer 520, as shown in FIG. 2D. Additionally, a plurality of amorphous semiconductor deposits 531 is formed on the cap layer 462 and spacers 464, 466. For illustration purposes, the amorphous semiconductor layers 510, 511 are depicted as two separate layers where in fact they are formed as a single amorphous semiconductor layer. Similarly, amorphous semiconductor layers 520, 521 are formed as a single amorphous semiconductor layer.

In one embodiment, the second precursor 900 is removed from the substrate 400 before the first precursor 800 is exposed to the substrate in FIG. 2D. For example, if the first precursor 800 comprises silane ($SiH_4$) only, the flow of second precursor 900 (i.e. hydrogen) to the substrate 400 is stopped before allowing the first precursor 900 to flow to the substrate 400 in FIG. 2D. On the other hand, if the first precursor 800 comprises a mixture of silane and hydrogen ($SiH_4+H_2$), then silane ($SiH_4$) is added to the second precursor 900 containing hydrogen ($H_2$) to obtain the mixture of silane and hydrogen ($SiH_4+H_2$).

Next, in FIG. 2E, the entire substrate 400 is exposed to the second precursor 900 to remove the plurality of amorphous semiconductor deposits 531 on the cap layer 462 and spacers 464, 466. The method of exposing the second precursor 900 to the substrate 400 in FIG. 2E is the same as FIG. 2C, and thus will not be discussed in detail here.

Figure 2F:
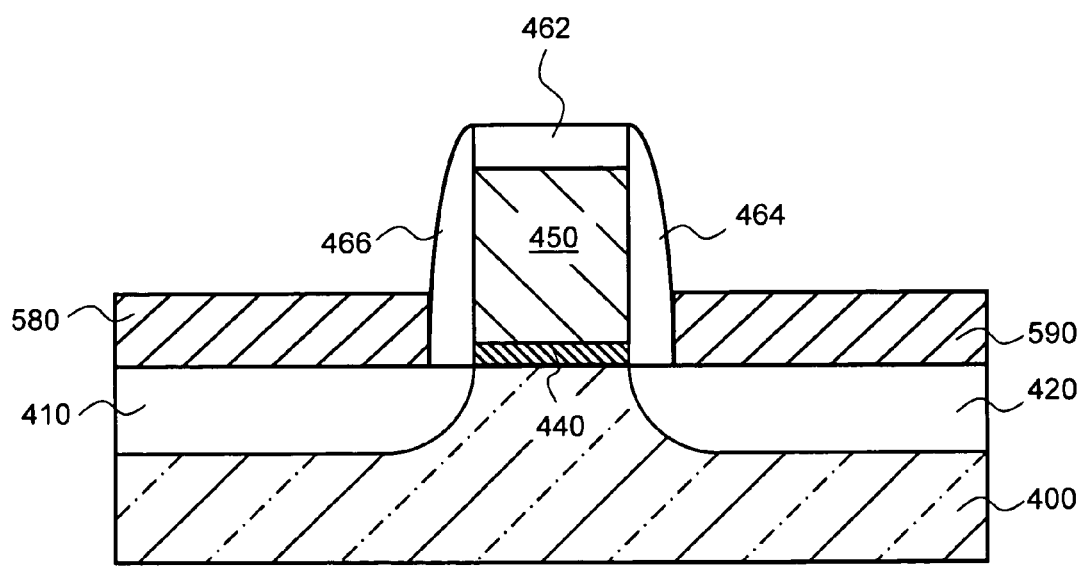

FIGS. 2D and 2E illustrate a subsequent cycle that can be repeated until the amorphous semiconductor layer with the desired thickness is formed on each of the source and drain regions 410, 420. FIG. 2F illustrates the semiconductor device having amorphous semiconductor layer 580 formed on source region 410 and amorphous semiconductor layer 590 formed on drain region 420, wherein both amorphous semiconductor layers 580, 590 are formed to the desired thickness. In one embodiment, 60-65 cycles may be performed to form amorphous semiconductor layers 580, 590 with a desired thickness of 400 Angstroms.

Figure 2G:
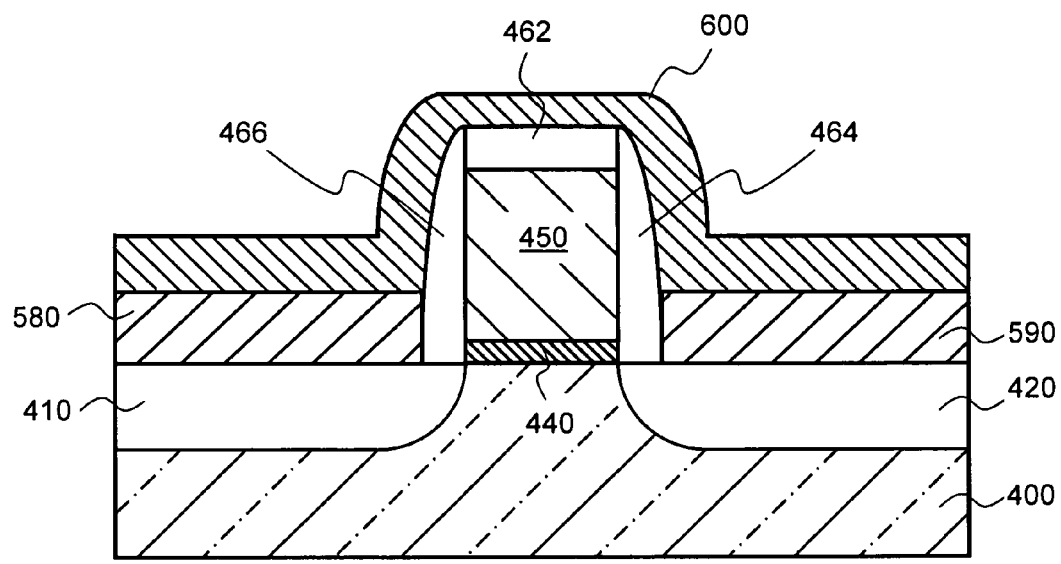

Next, in FIG. 2G, a metal layer 600 is blanket deposited onto the amorphous semiconductor layers 580, 590, cap layer 462 and spacers 464, 466. In one embodiment, the metal layer 600 is made from a material that can react with the amorphous semiconductor layers 580, 590 to form low resistance contact layers. In one specific embodiment, the metal layer 600 is made of metal or metal alloy such as but not limited to copper, nickel, platinum or titanium. In one specific embodiment, the metal layer 600 is made of rare earth metals such as but not limited to erbium and ytterbium.

Metal layer 600 can be deposited using well known techniques such as but not limited to PVD. In one embodiment, the metal layer 600 is deposited with the same thickness as the amorphous semiconductor layers 580, 590. In another embodiment, the metal layer 600 is deposited to a larger thickness than the amorphous semiconductor layers 580, 590.

Figure 2H:
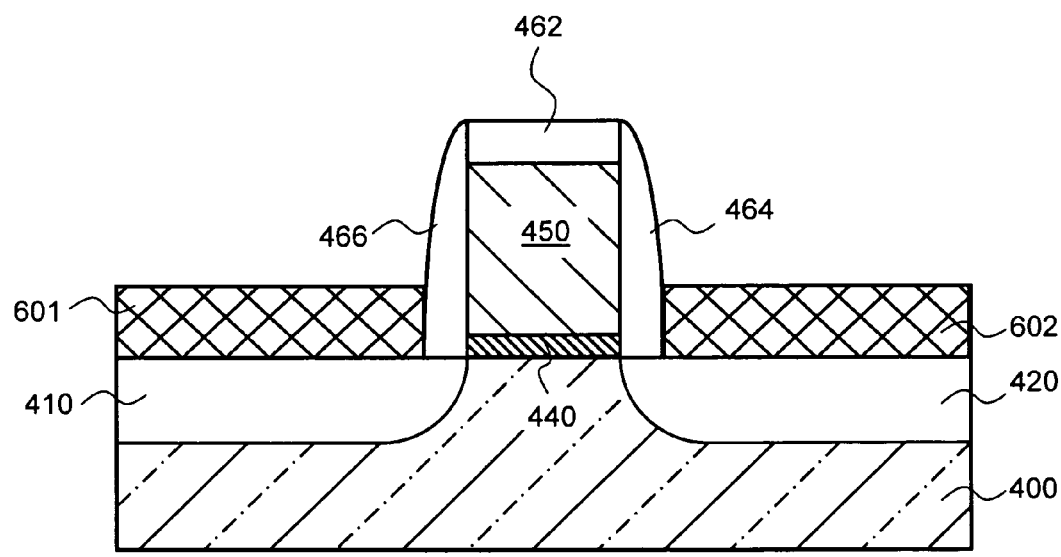

After depositing the metal layer 600, the substrate 400 undergoes an annealing process that causes an alloying reaction between the amorphous semiconductor layers 580, 590 and the metal layer 600. In particular, the amorphous semiconductor layers 580, 590 react with portions of the metal layer 600 deposited thereon to form low resistance contact layers 601, 602 as shown in FIG. 2H. In one embodiment, metal layer 600 reacts with the entire amorphous semiconductor layers 580, 590 to form low resistance contact layers 601, 602. In other words, the amorphous semiconductor layers 580, 590 are fully consumed by the metal layers 601, 602.

Since the amorphous semiconductor layers 580, 590 are only formed on the source and drain regions 410, 420, the low resistance contact layers 601, 602 as formed are self-aligned to the source and drain regions 410, 420. Furthermore, the thickness of the amorphous semiconductor layers, 580, 590 can be used to control the desired thickness of the low resistance contact layers 601, 602. The annealing process uses well known techniques, such as but not limited to rapid thermal anneal (RTA) or laser anneal.

In one embodiment, if the metal layer 600 is formed with a larger thickness than the amorphous semiconductor layers 580, 590, an un-reacted portion of the metal layer 600 remains on top of the low resistance contact layers 601, 602 after annealing to serve as a protective layer for the low resistance contact layers 601, 602. Furthermore, the time duration of the annealing process can be controlled to prevent excessive consumption by the metal layer 600 that results in recessing of the substrate 400.

In one embodiment, where the amorphous semiconductor layers 580, 590 are formed as amorphous silicon layers, then each of the low resistance contact layers 601, 602 is formed as a silicide layer. In a specific embodiment, RTA is performed on the amorphous silicon layers and a metal layer 600 made of nickel, at a temperature of 350-400 degrees Celsius and time duration of 1 hour to form nickel silicides (NiSi) as the low resistance contact layers 601, 602.

In another embodiment, where the amorphous semiconductor layers 580, 590 are formed as amorphous germanium layers, then each of the low resistance contact layers 601, 602 is formed as a germanide layer. In a specific embodiment, RTA is performed on the amorphous germanium layers and a metal layer 600 made of nickel, at a temperature of less than 350 degrees Celsius and time duration of 1 hour to form nickel germanides (NiGe) as the low resistance contact layers 601, 602.

After the annealing process, the portions of metal layer 600 deposited on cap layer 462 and spacers 464, 466 are removed by using well known techniques, such as but not limited to wet etching or using an etchant with a chemistry that etches the metal layer 600 but does not etches the cap layer 462, spacers 464, 466 and low resistance contact layers 601, 602.

In an embodiment of the present invention, the gate electrode 450 is a sacrificial gate electrode that is subsequently replaced by an actual gate electrode in a replacement gate process. In one embodiment, the replacement gate process begins by depositing a mask on the low resistance contact layers 601, 602 and then planarizing the mask to be coplanar with the cap layer 462. Next, the cap layer 462 and gate electrode 450 are removed using well known etching techniques. After removing the cap layer 462 and gate electrode 450, the actual gate electrode is then deposited on the gate dielectric layer 440.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A method of forming a semiconductor device comprising:
   providing a substrate having a source region, a drain region, a gate electrode, and spacers on the sidewalls of gate electrode;
   selectively depositing an amorphous semiconductor layer onto each of the source and drain regions by alternatingly exposing the substrate to a first precursor and a second precursor; comprising:
      exposing the substrate to the first precursor to deposit the amorphous semiconductor layer on the source region and drain region, and deposit a plurality of amorphous semiconductor deposits on the spacers; and
      exposing the substrate to the second precursor to remove the plurality of amorphous semiconductor deposits formed on the spacers;
   depositing a metal layer onto the amorphous semiconductor layer on each of the source and drain regions; and
   annealing the substrate so that the metal layer reacts with the amorphous semiconductor layer on each of the source and drain regions to form a low resistance contact layer on each of the source and drain regions.

2. The method of claim 1, wherein alternatingly exposing the substrate to the first precursor and the second precursor is repeated until the amorphous semiconductor layer is formed to a thickness of 400 Angstroms.

3. The method of claim 1, wherein the first precursor is a silicon-containing precursor and the second precursor is an etchant gas.

4. The method of claim 3, wherein the first precursor is silane and the second precursor is hydrogen.

5. The method claim 3, wherein the amorphous semiconductor layer deposited on each of the source and drain regions is an amorphous silicon layer.

6. The method of claim 3, wherein the low resistance contact layer formed on each of the source and drain regions is a silicide layer.

7. The method of claim 1, wherein the first precursor is a germanium-containing precursor and the second precursor is an etchant gas.

8. The method of claim 7, wherein the first precursor is germane and the second precursor is hydrogen.

9. The method claim 7, wherein the amorphous semiconductor layer deposited on each of the source and drain regions is an amorphous germanium layer.

10. The method of claim 7, wherein the low resistance contact layer formed on each of the source and drain regions is a germanide layer.

11. A method of forming a semiconductor device comprising:
    providing a substrate having a source region, a drain region, a gate electrode, and spacers on the sidewalls of gate electrode;
    selectively depositing an amorphous semiconductor layer onto each of the source and drain regions by alternatingly exposing the substrate to a first precursor and a second precursor at a constant low temperature of less than 400 degrees Celsius, wherein alternatingly exposing the substrate to the first precursor and the second precursor comprises:
       exposing the substrate to the first precursor to deposit the amorphous semiconductor layer on the source region and drain region, and deposit a plurality of amorphous semiconductor deposits on the spacers; and
       exposing the substrate to the second precursor to remove the plurality of amorphous semiconductor deposits formed on the spacers;
    depositing a metal layer onto the amorphous semiconductor layer on each of the source and drain regions; and
    annealing the substrate so that the metal layer reacts with the amorphous semiconductor layer on each of the source and drain regions to form a low resistance contact layer on each of the source and drain regions.

12. The method of claim 11, wherein alternatingly exposing the substrate to the first precursor and the second precursor is repeated until the amorphous semiconductor layer is formed to a thickness of 400 Angstroms.

13. The method of claim 11, wherein the first precursor is a silicon-containing precursor and the second precursor is an etchant gas.

14. The method of claim 13, wherein the first precursor is silane and the second precursor is hydrogen.

15. The method claim 13, wherein the amorphous semiconductor layer deposited on each of the source and drain regions is an amorphous silicon layer.

16. The method of claim 13, wherein the low resistance contact layer formed on each of the source and drain regions is a silicide layer.

17. The method of claim 11, wherein the first precursor is a germanium-containing precursor and the second precursor is an etchant gas.

18. The method of claim 17, wherein the first precursor is germane and the second precursor is hydrogen.

19. The method claim 17, wherein the amorphous semiconductor layer deposited on each of the source and drain regions is an amorphous germanium layer.

20. The method of claim 17, wherein the low resistance contact layer formed on each of the source and drain regions is a germanide layer.

* * * * *

UNITED STATES PATENT AND TRADEMARK OFFICE
CERTIFICATE OF CORRECTION

PATENT NO. : 8,088,665 B2  
APPLICATION NO. : 12/228386  
DATED : January 3, 2012  
INVENTOR(S) : Willy Rachmady et al.

Page 1 of 1

It is certified that error appears in the above-identified patent and that said Letters Patent is hereby corrected as shown below:

In column 7, line 37, in claim 5, delete "method" and insert -- method of --, therefor.

In column 7, line 48, in claim 9, delete "method" and insert -- method of --, therefor.

In column 8, line 35, in claim 15, delete "method" and insert -- method of --, therefor.

In column 8, line 46, in claim 19, delete "method" and insert -- method of --, therefor.

Signed and Sealed this
Twentieth Day of March, 2012

David J. Kappos
*Director of the United States Patent and Trademark Office*